United States Patent
Fujita et al.

(10) Patent No.: US 12,165,977 B2
(45) Date of Patent: Dec. 10, 2024

(54) TERAHERTZ MODULE

(71) Applicants: ROHM CO., LTD., Kyoto (JP); OSAKA UNIVERSITY, Suita (JP)

(72) Inventors: Masayuki Fujita, Suita (JP); Daniel Jonathan Headland, Suita (JP); Tadao Nagatsuma, Suita (JP); Yosuke Nishida, Kyoto (JP)

(73) Assignees: ROHM CO., LTD., Kyoto (JP); OSAKA UNIVERSITY, Osaka (JP)

( * ) Notice: Subject to any disclaimer, the term of this patent is extended or adjusted under 35 U.S.C. 154(b) by 110 days.

(21) Appl. No.: 18/003,819

(22) PCT Filed: Jul. 8, 2021

(86) PCT No.: PCT/JP2021/025773
§ 371 (c)(1),
(2) Date: Dec. 29, 2022

(87) PCT Pub. No.: WO2022/019136
PCT Pub. Date: Jan. 27, 2022

(65) Prior Publication Data
US 2023/0260913 A1  Aug. 17, 2023

(30) Foreign Application Priority Data
Jul. 20, 2020  (JP) .................................. 2020-123912

(51) Int. Cl.
*H01L 23/538* (2006.01)
*H01L 21/768* (2006.01)
(Continued)

(52) U.S. Cl.
CPC ...... *H01L 23/538* (2013.01); *H01L 21/76802* (2013.01); *H01L 29/66219* (2013.01); *H01P 3/16* (2013.01); *H04B 10/572* (2013.01)

(58) Field of Classification Search
CPC ............. H01L 23/538; H01L 21/76802; H01L 29/66219; H01P 3/16; H04B 10/572;
(Continued)

(56) References Cited

U.S. PATENT DOCUMENTS

2005/0191774 A1* 9/2005 Li .......................... B82Y 10/00 438/22
2011/0169405 A1  7/2011 Baik et al.
(Continued)

FOREIGN PATENT DOCUMENTS

JP  2014-197837 A  10/2014
JP  2015-187716 A  10/2015

OTHER PUBLICATIONS

Xiongbin Yu et al., "Efficient mode converter to deep-subwavelength region with photonic-crystal waveguide platform for terahertz applications", vol. 27, No. 20, Sep. 30, 2019, Optics Express pp. 28707-28721.
(Continued)

*Primary Examiner* — Hibret A Woldekidan
(74) *Attorney, Agent, or Firm* — HSML P.C.

(57) ABSTRACT

A terahertz module includes: a terahertz chip which includes an active device which emits a terahertz wave; and a dielectric substrate coupled to the terahertz chip. The terahertz chip includes a semiconductor substrate. The active device is disposed on an upper surface of the semiconductor substrate. A cutout is formed in a portion of a first side surface, among a plurality of side surfaces of the dielectric substrate, the cutout extending from an upper side of the first side surface to a lower side of the first side surface. The terahertz chip is fit into the cutout in such a direction that the upper surface of the semiconductor substrate is parallel to the first side surface and the semiconductor substrate is arranged in a bottom side of the cutout.

16 Claims, 14 Drawing Sheets

(51) Int. Cl.
*H01L 29/66* (2006.01)
*H01P 3/16* (2006.01)
*H04B 10/572* (2013.01)

(58) Field of Classification Search
CPC .... H04B 10/50; H04B 10/801; H04B 10/803; G02B 1/007; G02B 3/02; G02B 2006/12121; G02B 6/34
See application file for complete search history.

(56) References Cited

U.S. PATENT DOCUMENTS

| | | |
|---|---|---|
| 2014/0248020 A1 | 9/2014 | Fujita et al. |
| 2016/0178843 A1* | 6/2016 | Fujita ................ H01Q 1/00 385/14 |
| 2019/0044211 A1 | 2/2019 | Drouin et al. |

OTHER PUBLICATIONS

International Search Report for PCT/JP2021/025773 dated Sep. 28, 2021 and English Translation thereof, 5 pages.
Written Opinion for PCT/JP2021/025773 dated Sep. 28, 2021 and English Translation thereof, 9 pages.

* cited by examiner

TERAHERTZ MODULE

TECHNICAL FIELD

The present disclosure relates to a terahertz module.

BACKGROUND ART

In recent years, application of information communications with use of electromagnetic wave, such as mobile phones, is expanding. The frequency and the wavelength are values that characterize the electromagnetic wave. In general, the higher the frequency is, a larger capacity of information the electromagnetic wave can carry. Therefore, adoption of electromagnetic waves (millimeter waves) in 28 Gigahertz (GHz) frequency band or 39 GHz frequency band is considered for 5G, which is the standard for the next-generation mobile phone. In contrast, research is progressing on the terahertz wave, which is an electromagnetic wave at a higher frequency, aiming at the realization of ultra high speed wireless communications beyond 5G. For commercialization of an application system adopting the terahertz wave, development of terahertz wave generator and detector by an electronic device capable of compact integration is expected.

For example, NPL 1 discloses connecting the waveguide of a photonic crystal, which is a dielectric substrate, to a terahertz chip via a metallic mode conversion mechanism. With this configuration, it is reported that up to 90% coupling efficiency is attained between the terahertz chip and the dielectric substrate in the 0.3 THz band.

CITATION LIST

Non Patent Literature

NPL 1: XIONGBIN Yu, JAE-YOUNG Kim, MASAYUKI FUJITA, TADAO NAGATSUMA, Vol, 27, No. 20/30 September 2019, Optics Express 28707.

SUMMARY OF INVENTION

Technical Problem

NPL 1 requires the terahertz chip to have a thickness about half the thickness of the photonic crystal. However, it is not easy to thin the terahertz chip to such a thickness.

Therefore, an object of the present disclosure is to provide a terahertz module that has high coupling efficiency attained between a terahertz chip and a dielectric substrate, without having to thin the terahertz chip.

Solution to Problem

A terahertz module according to the present disclosure includes: a terahertz chip which includes an active device that emits a terahertz wave; and a dielectric substrate coupled to the terahertz chip. The terahertz chip includes a semiconductor substrate and the active device is disposed on an upper surface of the semiconductor substrate. A cutout is formed in a portion of a first side surface, among a plurality of side surfaces of the dielectric substrate, the cutout extending from an upper side of the first side surface to a lower side of the first side surface. The terahertz chip is fit into the cutout in such a direction that the upper surface of the semiconductor substrate is parallel to the first side surface and the semiconductor substrate is arranged in a bottom side of the cutout.

Preferably, the cutout has a surface parallel to the first side surface. The semiconductor substrate of the terahertz chip has a lower surface in contact with a surface of the cutout parallel to the first side surface.

Preferably, the terahertz chip has a thickness which is equal to a depth of the cutout.

Preferably, the terahertz chip has a thickness greater than a depth of the cutout.

Preferably, the dielectric substrate is a photonic crystal.

Preferably, a waveguide for the terahertz wave is formed on the photonic crystal in a direction perpendicular to the upper surface of the semiconductor substrate.

Preferably, a filter for passing or filtering out a predetermined frequency component of the terahertz wave is formed on the photonic crystal.

Preferably, a planar lens for collecting the terahertz wave emitted by the active device is formed on the photonic crystal.

Preferably, a plurality of the terahertz chips disposed in a row are coupled to the photonic crystal.

Preferably, the active device is a resonant tunneling diode.

Advantageous Effects of Invention

According to the terahertz module of the present disclosure, high coupling efficiency is attained between the terahertz chip and the dielectric substrate, without having to thin the terahertz chip.

DESCRIPTION OF EMBODIMENTS

Hereinafter, embodiments will be described, with reference to the accompanying drawings.

Conventional Structure

A structure disclosed in NPL 1 is now described.

Figure 1:
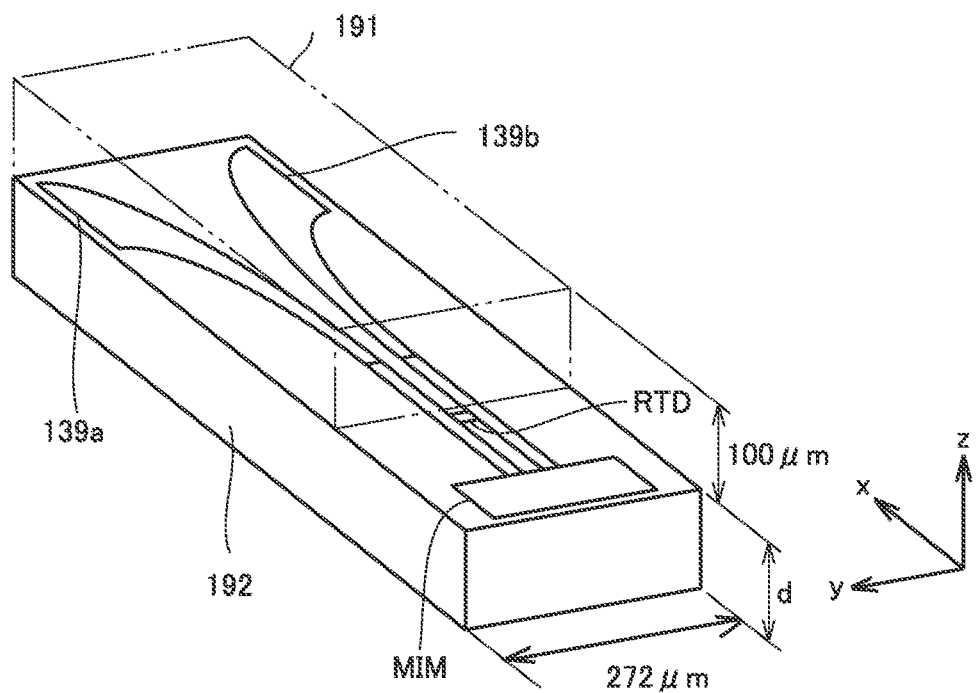
FIG. 1 is a perspective view of a terahertz chip 192 disclosed in NPL 1.
Figure 2:
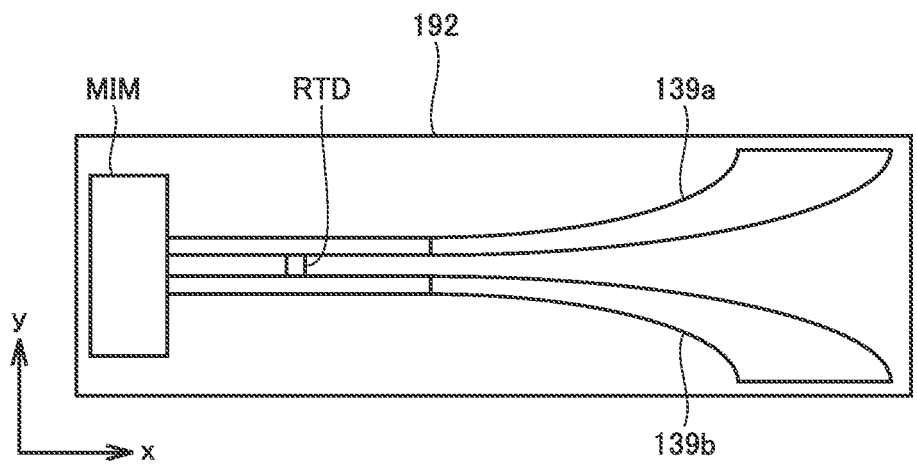
FIG. 2 is a top view of the terahertz chip 192 disclosed in NPL 1.
Figure 3:
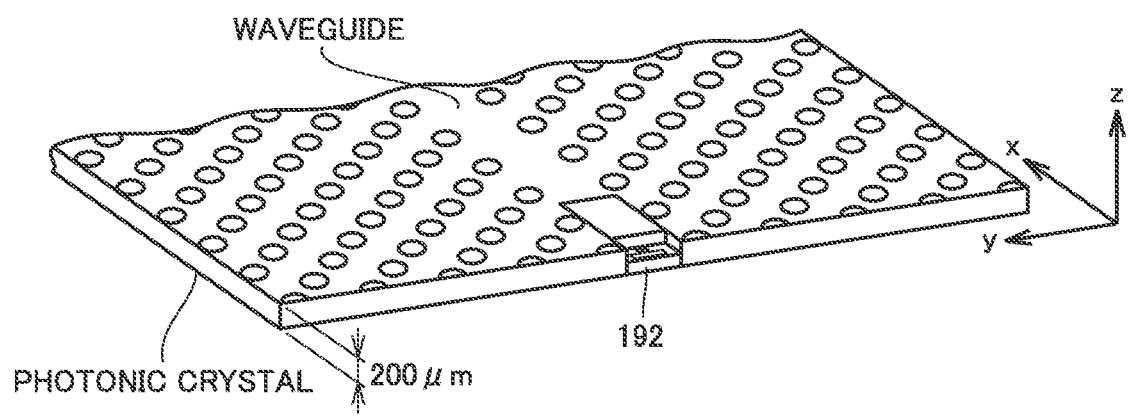
FIG. 3 is a diagram depicting a terahertz module disclosed in NPL 1.

FIG. 1 is a perspective view of a terahertz chip 192 disclosed in NPL 1. FIG. 2 is a top view of the terahertz chip 192 disclosed in NPL 1. FIG. 3 is a diagram depicting a terahertz module disclosed in NPL 1.

A resonant tunneling diode (RTD) oscillates a high frequency electromagnetic wave (terahertz wave) at a terahertz band frequency. The RTD may also be caused to operate as a detector with ultrahigh sensitivity. A metal insulator metal (MIM) operates as a reflective mirror for reflecting the terahertz wave. The terahertz module is configured of the terahertz chip 192 and a photonic crystal being coupled together.

Conductive paths 139a, 139b have tapered shapes whose dimension in y-direction increases toward x-direction. This solves problems due to the difference in scale between the terahertz chip and the waveguide of the photonic crystal, thereby attaining a high coupling rate between the terahertz chip and the photonic crystal.

In order to reduce symmetry and radiation loss, an InP substrate 191 is disposed on the top surface of the terahertz chip 192.

In order to attain a high coupling rate between the terahertz chip 192 and the photonic crystal, the terahertz chip 192 needs to have a thickness d about half (100 μm) the thickness (200 μm) of the photonic crystal. This is because the photonic crystal has a largest coupling efficiency at the center portion in the direction of thickness of the photonic crystal. An increase of the frequency of the terahertz wave reduces the wavelength of the terahertz wave. Thus, the terahertz chip 192 needs to have a reduced thickness d, which is difficult to process.

Embodiment 1

Referring to FIGS. 4 through 8, a configuration of the terahertz module is now described.

Figure 4:
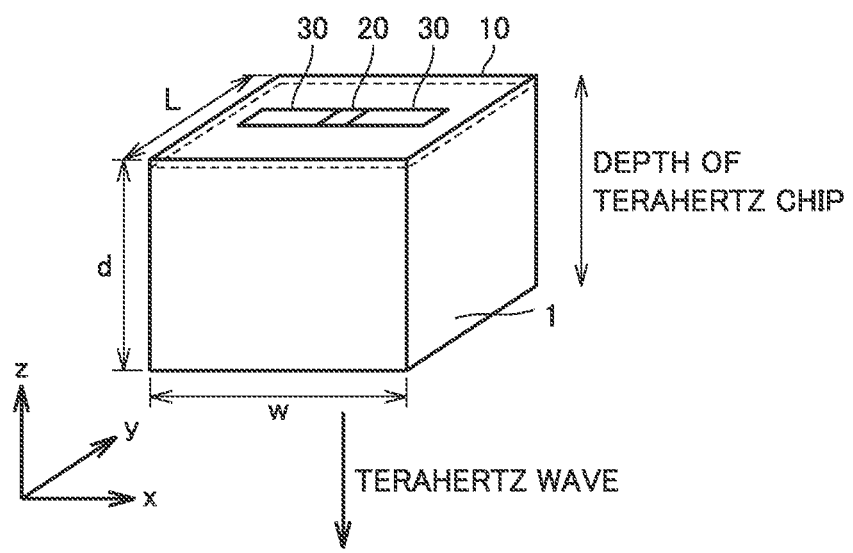
FIG. 4 is a diagram depicting an appearance of a terahertz chip 10.

FIG. 4 is a diagram depicting an appearance of a terahertz chip 10.

The terahertz chip 10 has a width w, a length L, and a thickness d. The direction of the width w of the terahertz chip 10 will be referred to as an x direction. The direction of the length L of the terahertz chip 10 will be referred to as a y direction. The direction of the thickness d of the terahertz chip 10 will be referred to as a z direction.

In the terahertz chip 10, a RTD 20 and a slot 30 are disposed on the upper surface (the top surface) of the InP substrate 1 which is a semiconductor substrate. As shown in FIG. 4, the terahertz wave propagates in the direction of thickness of (a negative z-direction) of the terahertz chip.

Suppose that the bottom surface of the terahertz chip 10 is the lower surface (the undersurface) of the InP substrate 1.

Figure 5:
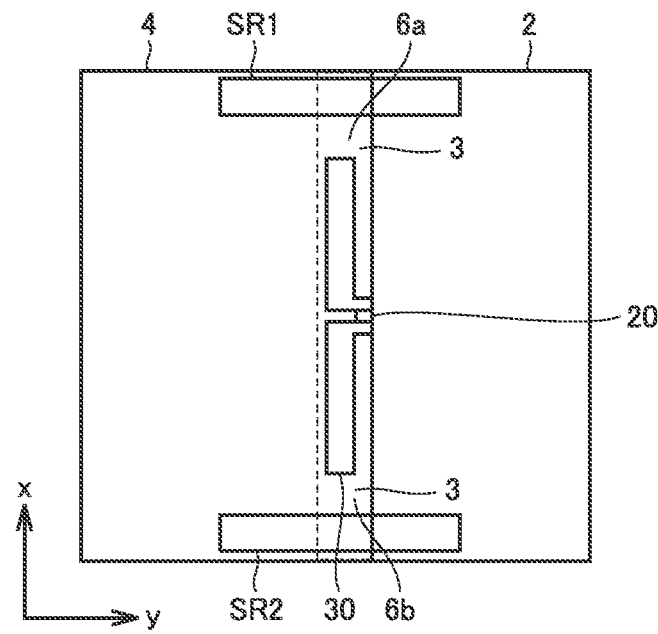
FIG. 5 is a diagram showing the terahertz chip 10 as viewed from the top to the bottom (negative Z direction).
Figure 6:
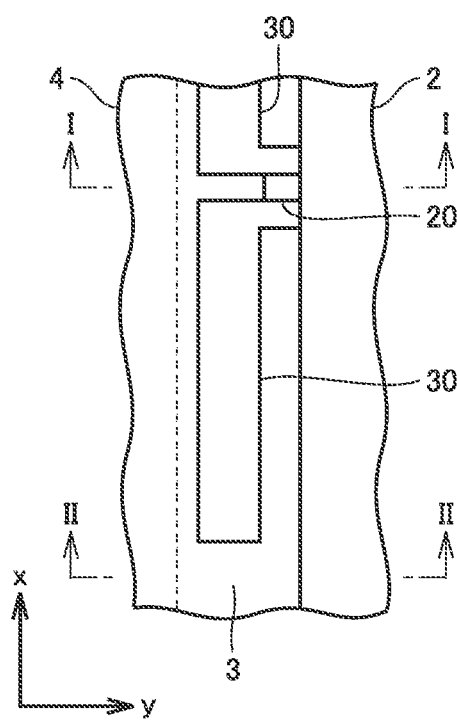
FIG. 6 is an enlarged view of the terahertz chip 10 of FIG. 5 around a resonant tunneling diode 20.

FIG. 5 is a diagram showing the terahertz chip 10 as viewed from the top to the bottom (the negative z-direction). FIG. 6 is an enlarged view of the terahertz chip 10 of FIG. 5 around the RTD 20.

Shunt resistors SR1, SR2 are formed in regions that are formed between an upper electrode 4 and a lower electrode 2 in the direction of thickness (the z direction) of the terahertz chip 10 and traverse across the upper electrode 4 and the lower electrode 2 in the y direction. The shunt resistors SR1, SR2 have functionality of reducing parasitics.

The slot 30 and the RTD 20 are formed below the upper electrode 4 in the direction of thickness (the z direction) of the terahertz chip 10.

MIM capacitors 6a, 6b are formed at a portion where the upper electrode 4 and the lower electrode 2 overlap in the y direction, the portion being between the upper electrode 4 and the lower electrode 2 in the direction of thickness (the z direction) of the terahertz chip 10.

Figure 7:
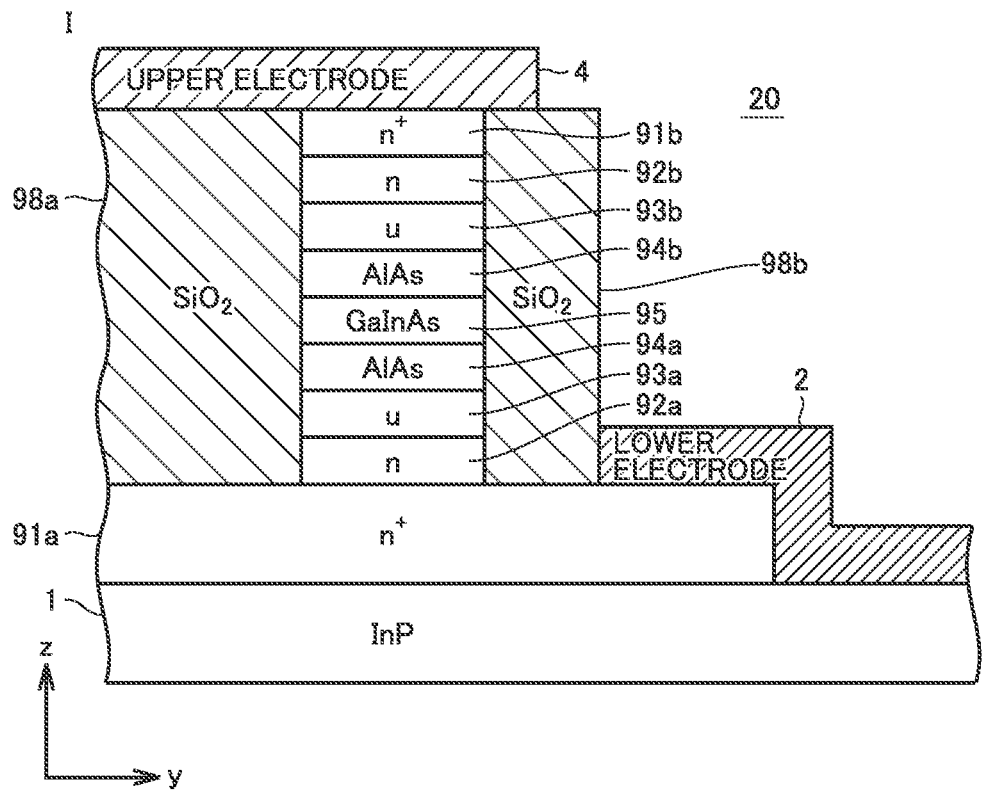
FIG. 7 is a cross-sectional view of the terahertz chip 10, taken along I-I line of FIG. 6.

FIG. 7 is a cross-sectional view of the terahertz chip 10, taken along I-I line of FIG. 6. A direction perpendicular to the surfaces (the upper surface and the lower surface) of the InP substrate 1 is the z direction.

The RTD 20 includes: a GaInAs layer 91a heavily doped with an n type impurity, which is disposed on the upper surface of the InP substrate 1; a GaInAs layer 92a doped with an n type impurity, which is disposed on the upper surface of the GaInAs layer 91a; an undoped GaInAs layer 93a disposed on the upper surface of the GaInAs layer 92a; an AlAs layer 94a disposed on the upper surface of the GaInAs layer 93a; a GaInAs layer 95 disposed on the upper surface of the AlAs layer 94a; an AlAs layer 94b disposed on the upper surface of the GaInAs layer 95; an undoped GaInAs layer 93b disposed on the upper surface of the AlAs layer 94b; a GaInAs layer 92b doped with an n type impurity, which is disposed on the upper surface of the GaInAs layer 93b; and a GaInAs layer 91b heavily doped with an n type impurity, which is disposed on the upper surface of the GaInAs layer 92b.

$SiO_2$ films 98a, 98b are deposit on the sides of the RTD 20.

The upper electrode 4 is disposed on the upper surface of the GaInAs layer 91b.

The lower electrode 2 is disposed on the upper surface of the GaInAs layer 91a and the upper surface of the InP substrate 1.

Here, the thicknesses of the respective layers are, for example, as follows. However, the present disclosure is not limited thereto.

The n+ type GaInAs layers 91a, 91b each have a thickness of, for example, approximately 400 nm and approximately 15 nm, respectively. The n type GaInAs layers 92a and 92b have substantially the same thickness, for example, approximately 25 nm. The undoped GaInAs layers 93a and 93b have thicknesses of approximately 2 nm and approximately 20 nm, respectively. The AlAs layers 94a and 94b have the same thickness, for example, approximately 1.1 nm. The GaInAs layer 95 has a thickness of, for example, approximately 4.5 nm. The InP substrate 1 has a thickness of a few hundreds of micrometers.

The upper electrode 4 and the lower electrode 2 both include a metal layer stack structure of Au/Pd/Ti or Au/Ti, for example. The Ti layer is a buffer layer for good contact with the semi-insulating InP substrate 1. The thicknesses of the upper electrode 4 and the lower electrode 2 are, for example, approximately a few hundreds of nanometers, resulting in a flattened stack structure as a whole. The upper electrode 4 and the lower electrode 2 can both be formed by vacuum deposition or sputtering, for example.

As noted above, the RTD 20 is disposed on the upper surface of the InP substrate 1. The RTD 20 forms a resonator between the lower electrode 2 and the upper electrode 4. The electromagnetic wave emitted by the RTD 20 has a surface emitting radiation pattern in a direction perpendicular to the upper surface of the InP substrate 1.

Figure 8:
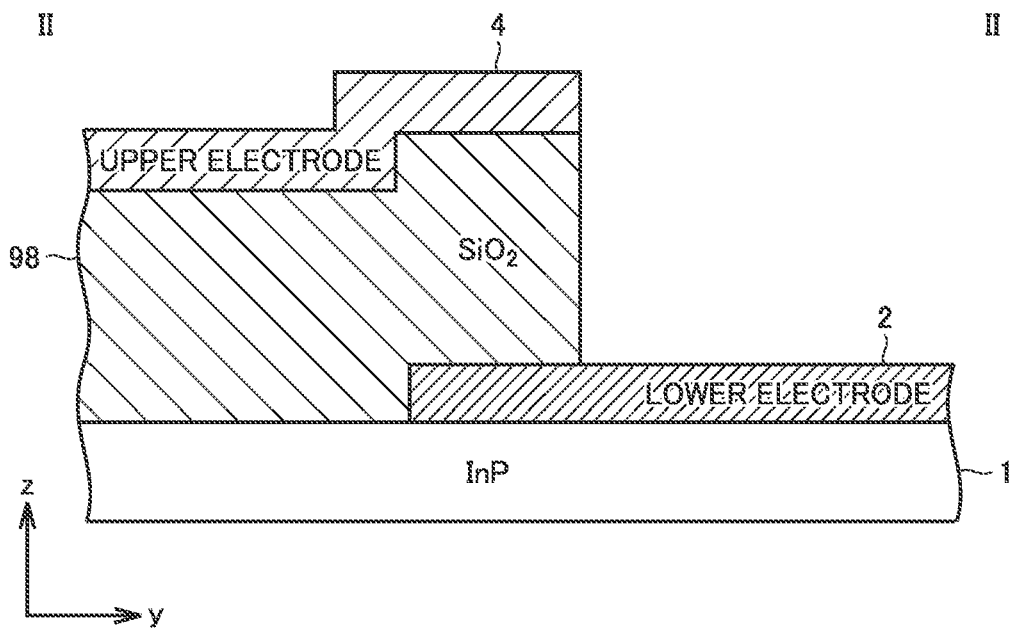
FIG. 8 is a cross-sectional view of the terahertz chip 10, taken along II-II line of FIG. 6.

FIG. 8 is a cross-sectional view of the terahertz chip 10, taken along II-II line of FIG. 6.

The MIM capacitors 6a, 6b are formed of the $SiO_2$ film 98 that is disposed at the portion where the upper electrode 4 and the lower electrode 2 overlap in the y direction, the portion being between the upper electrode 4 and the lower electrode 2 in the direction of thickness (the z direction) of the terahertz chip 10.

Figure 9:
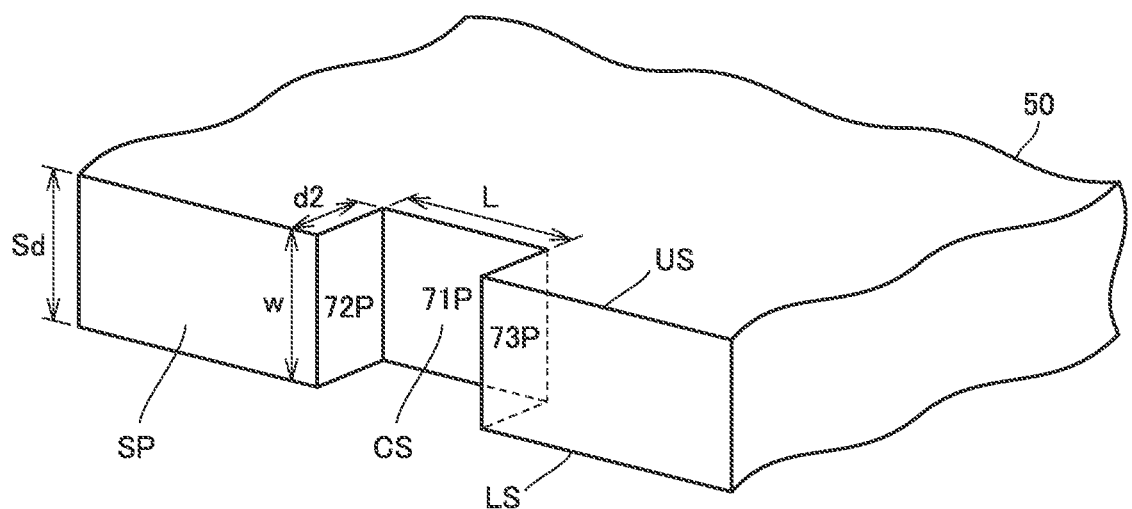
FIG. 9 is a diagram depicting a dielectric substrate 50 according to Embodiment 1.

FIG. 9 is a diagram depicting the dielectric substrate 50 according to Embodiment 1.

The dielectric substrate 50 can implement a terahertz wave-polarizing function, a frequency-filtering function, and a function as a planar lens. The dielectric substrate 50 is configured of a dielectric such as a photonic crystal. A circuit device deployed onto the dielectric substrate 50 does not use metal interconnect, resulting in a low-loss system being implemented in a high-frequency terahertz band.

The dielectric substrate 50 has a thickness of Sd. A cutout CS is formed in a first side surface SP, among multiple side surfaces of the dielectric substrate 50. The cutout CS is formed in a direction perpendicular to the first side surface SP, extending from an upper side US of the first side surface SP to a lower side LS of the first side surface SP.

The cutout CS has a cuboid shape. The cutout CS has a length of L, a width of w, and a depth of d2, where w=Sd and d2<d. The cutout CS has a surface 71P, a surface 72P, and a surface 73P. The surface 71P is parallel to the first side surface SP. The surface 72P and the surface 73P are perpendicular to the first side surface SP.

Figure 10:
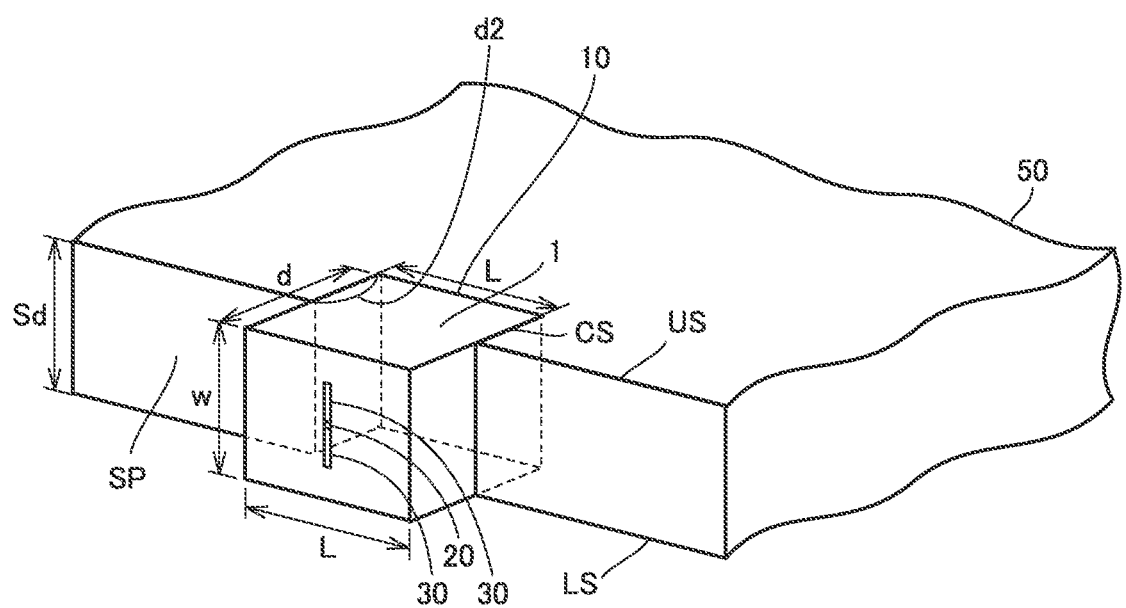
FIG. 10 is a diagram depicting a terahertz module according to Embodiment 1.

FIG. 10 is a diagram depicting the terahertz module according to Embodiment 1.

The terahertz module includes the terahertz chip 10 and the dielectric substrate 50 coupled to the terahertz chip 10.

The terahertz chip 10 is fit into the cutout CS of the dielectric substrate 50. The terahertz chip 10 is fit into the cutout CS of the dielectric substrate 50 in such a direction that the upper surface of the InP substrate 1 is parallel to the first side surface SP of the cutout CS and the InP substrate 1 is arranged in a bottom side of the cutout CS. The bottom surface of the terahertz chip 10 (the lower surface (the undersurface) of the InP substrate 1) is in contact with the surface 71P. Two side surfaces of the terahertz chip 10 are in contact with the two surfaces 72P and 73P, respectively, of the cutout CS.

The thickness d of the terahertz chip 10 is greater than the depth d2 of the cutout CS. Accordingly, the uppermost surface of the terahertz chip 10 is outside the dielectric substrate 50.

In the present embodiment, the terahertz chip 10 can have any thickness. The direction of thickness of the terahertz chip 10 is the same as the direction of the top surface of the dielectric substrate 50, which obviates the need for thinning the terahertz chip 10.

The result of simulation suggests that the terahertz module according to the present embodiment can attain 90% coupling efficiency, as with the terahertz module according to the conventional example.

Figure 11:
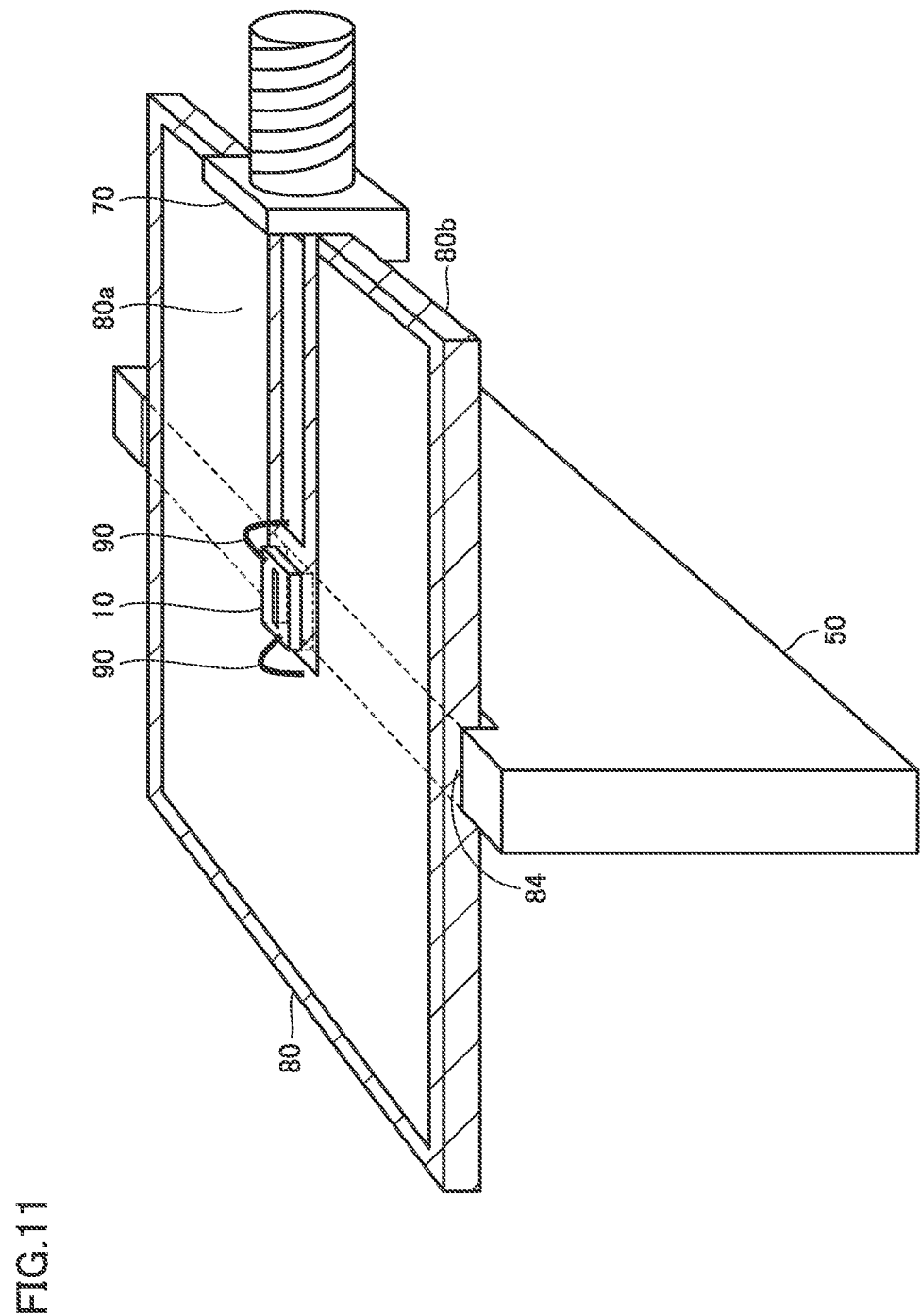
FIG. 11 is a diagram illustrating an example of a method of implementation of the terahertz module according to Embodiment 1.

FIG. 11 is a diagram illustrating an example of a method of implementation of the terahertz module according to Embodiment 1.

A groove 84 of the dielectric substrate 50 corresponds to the first side surface SP. Although not shown, the cutout CS is formed in the first side surface SP into which the terahertz chip 10 is fit.

A microwave circuit board 80 includes a metallic layer 80a and a resin layer 80b. Signals and voltages are transmitted from a coaxial connector 70 to the metallic layer 80a of the microwave circuit board 80. These signals and voltages are further sent to the terahertz chip 10 through bonding wires 90.

As described above, according to the present embodiment, the terahertz chip and the dielectric substrate are coupled together by fitting the terahertz chip into the cutout formed in a side surface of the dielectric substrate, thereby attaining a high coupling efficiency between the terahertz chip and the dielectric substrate, without having to thin the terahertz chip.

Embodiment 2

Figure 12:
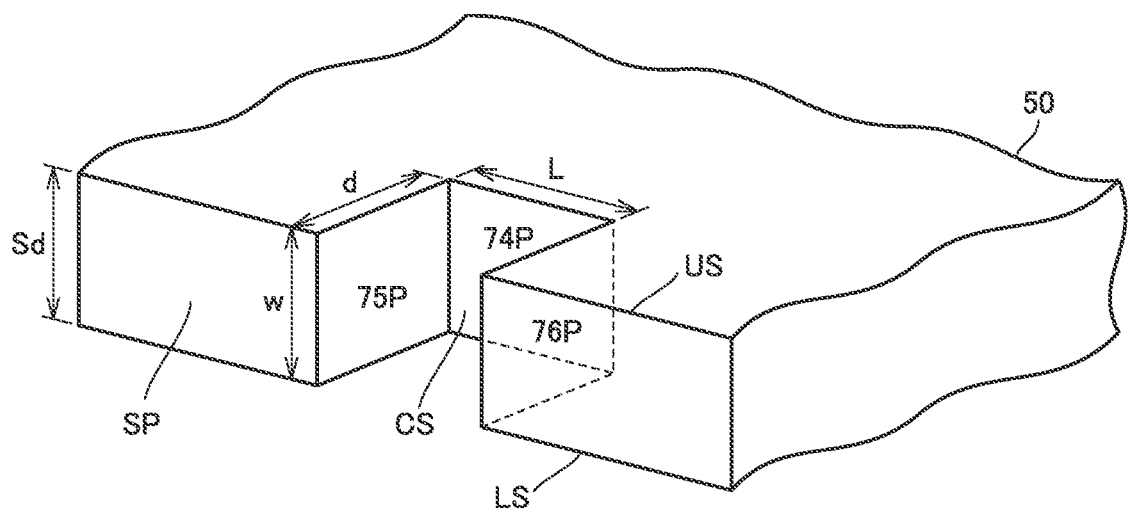
FIG. 12 is a diagram depicting a dielectric substrate 50 according to Embodiment 2.

FIG. 12 is a diagram depicting a dielectric substrate 50 according to Embodiment 2.

The dielectric substrate 50 has a thickness of Sd. A cutout CS is formed in a first side surface SP of the dielectric substrate 50. The cutout CS is formed in a direction perpendicular to the first side surface SP, from an upper side US to a lower side LS of the first side surface SP.

The cutout CS has a cuboid shape. The cutout CS has a length of L, a width of w, and a depth of d, where w=Sd. The cutout CS has a surface 74P, a surface 75P, and a surface 76P. The surface 74P is parallel to the first side surface SP. The surface 75P and the surface 76P are perpendicular to the first side surface SP.

Figure 13:
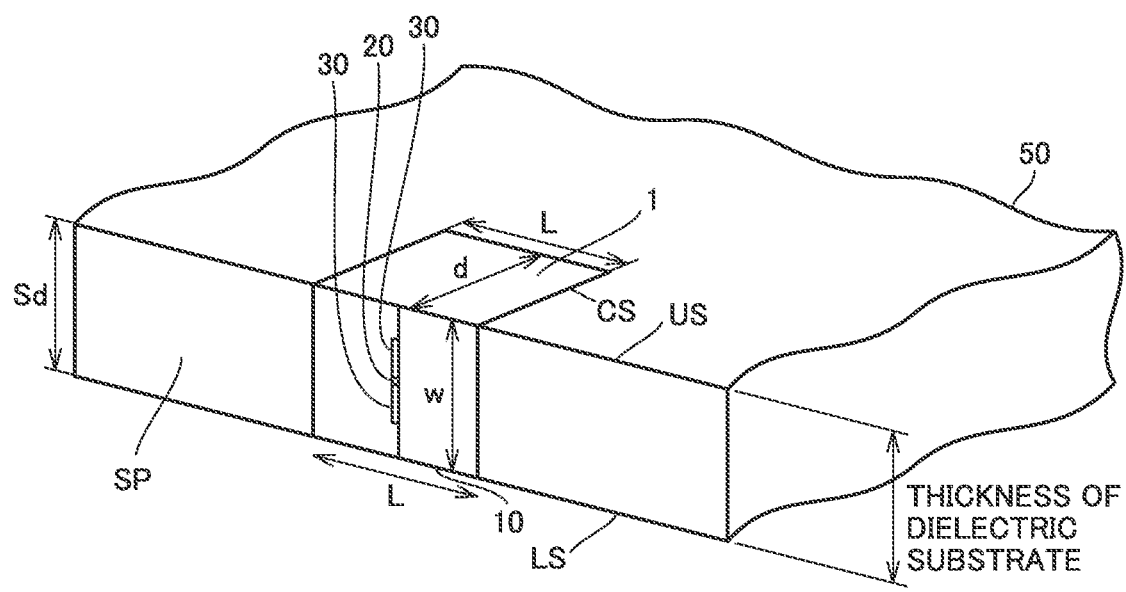
FIG. 13 is a diagram depicting a terahertz module according to Embodiment 2.

FIG. 13 is a diagram depicting a terahertz module according to Embodiment 2.

The terahertz module includes a terahertz chip 10 and a dielectric substrate 50 coupled to the terahertz chip 10.

The terahertz chip 10 is fit into the cutout CS of the dielectric substrate 50. The terahertz chip 10 is fit into the cutout CS of the dielectric substrate 50 in such a direction that the upper surface of an InP substrate 1 is parallel to the first side surface SP of the cutout CS and the InP substrate 1 is arranged in a bottom side of the cutout CS. The bottom surface of the terahertz chip 10 (the lower surface (the undersurface) of the InP substrate 1) is in contact with the surface 74P. Two side surfaces of the terahertz chip 10 are in contact with the two surfaces 75P and 76P, respectively, of the cutout CS.

The terahertz chip 10 has a thickness d equal to a depth d of the cutout CS. Accordingly, the uppermost surface of the terahertz chip 10 connects to the first side surface SP of the dielectric substrate 50.

Even in the present embodiment, the terahertz chip 10 can have any thickness, as with Embodiment 1. The direction of thickness of the terahertz chip 10 is the same as the direction of the top surface of the dielectric substrate 50, which thus obviates the need for thinning the terahertz chip 10.

Embodiment 3

Figure 14:
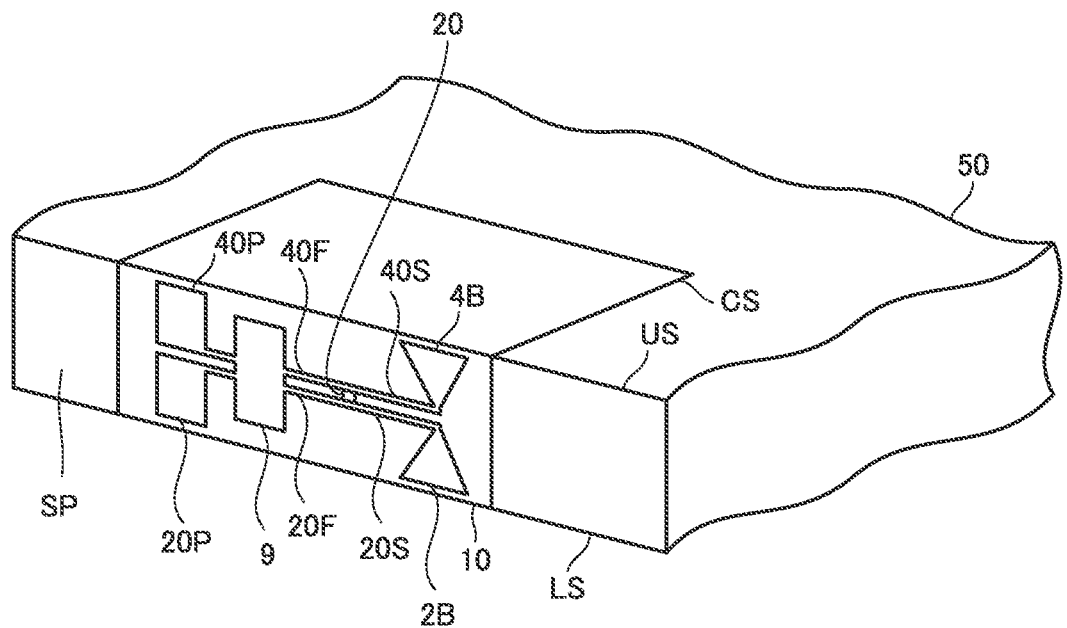
FIG. 14 is a diagram depicting a terahertz module according to Embodiment 3.

FIG. 14 is a diagram depicting a terahertz module according to Embodiment 3.

As with Embodiment 2, a terahertz chip 10 is fit into a cutout CS of a dielectric substrate 50. A bow-tie antenna is formed on the terahertz chip 10.

The terahertz chip 10 includes antenna electrodes 4B and 2B, first transmission lines (slots) 40S and 20S, a resonant tunneling diode (RTD) 20, second transmission lines (slots) 40F and 20F, pad electrodes 40P and 20P, and a low-pass filter 9.

The antenna electrodes 4B and 2B are capable of transmitting/receiving terahertz waves to/from a free space. The first transmission lines 40S and 20S are connected to the antenna electrodes 4B and 2B, and capable of transmitting the terahertz waves.

The RTD 20 has a primary electrode connected to the first transmission lines 40S and 20S.

The second transmission lines 40F and 20F are connected to the RTD 20, and capable of transmitting the terahertz waves.

The pad electrodes 40P and 20P are connected to the second transmission lines 40F and 20F.

The low-pass filter 9 is connected to the pad electrodes 40P and 20P.

The impedances between the RTD 20 and the antenna electrodes 4B and 2B can be matched by transforming the impedances of the first transmission lines 40S and 20S. The pad electrodes 20P and 40P can comprise electrodes for supplying bias power supply and data signal.

The low-pass filter 9 may include a metal insulator metal (MIM) reflector. A resistor element may be connected between the pad electrode 40P and the pad electrode 20P. The resistor element may include a metal interconnect. The metal interconnect may include bismuth, nickel, titanium, or platinum.

The spacing between the antenna electrodes 4B and 2B of the bow-tie antenna is substantially the same as the spacing between the transmission lines (slotlines).

The RTD 20 has the same cross section as described with respect to FIG. 7 of Embodiment 1.

The terahertz chip including the bow-tie antenna, instead of the slot antenna according to Embodiment 1, can also provide advantageous effects similar to Embodiment 1.

Embodiment 4

In the present embodiment, example applications of the terahertz module described in the above embodiments are now set forth.

A photonic crystal B1 can be used as a dielectric substrate 50.

Figure 15:
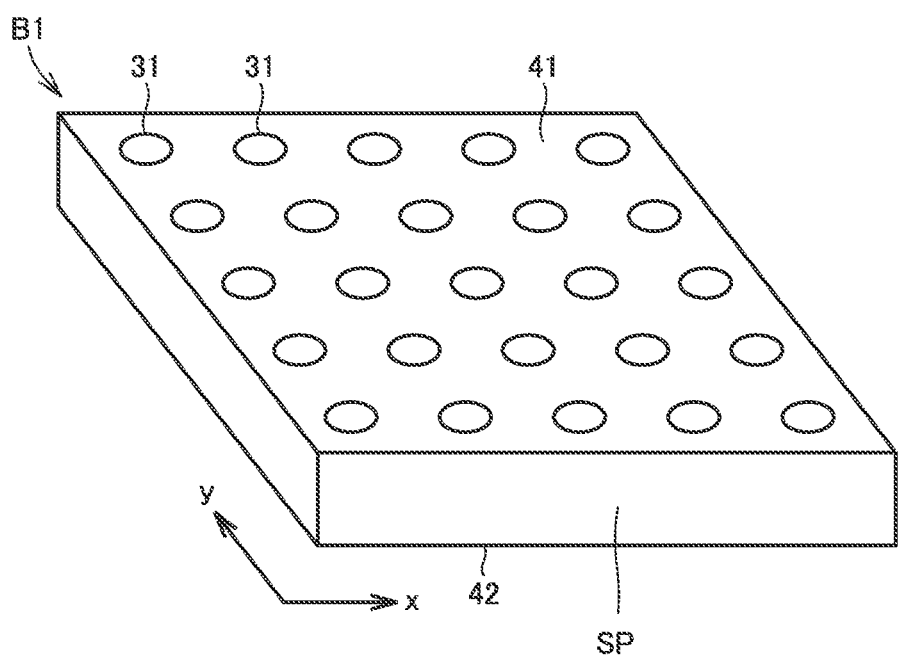
FIG. 15 is a perspective view of a photonic crystal B1.
Figure 16:
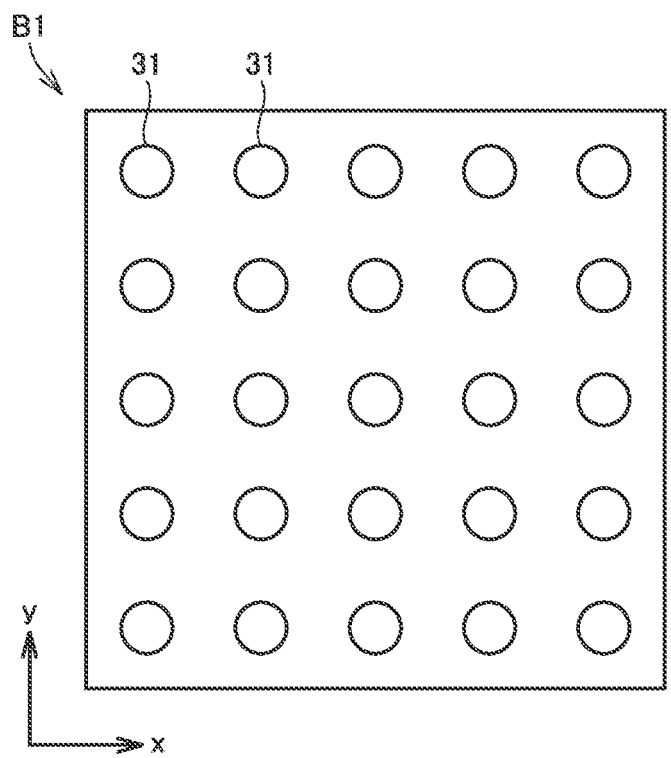
FIG. 16 is a plan view of a photonic crystal B1.
Figure 17:
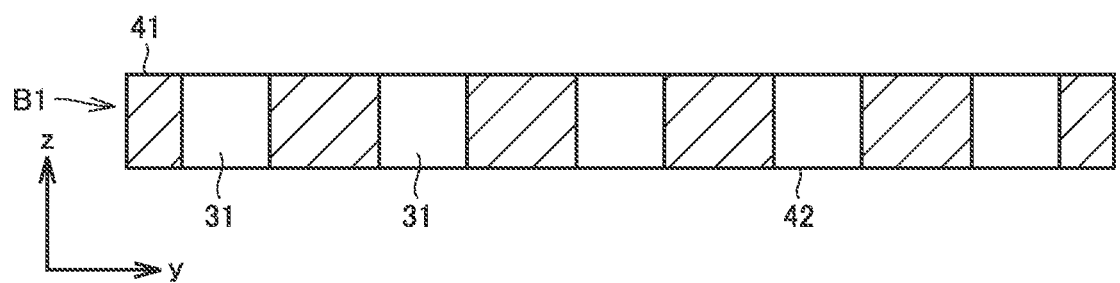
FIG. 17 is a cross-sectional view of the photonic crystal B1.

FIG. 15 is a perspective view of the photonic crystal B1. FIG. 16 is a plan view of the photonic crystal B1. FIG. 17 is a cross-sectional view of the photonic crystal B1.

For example, the photonic crystal B1 is referred to as a two-dimensional photonic crystal slab. The photonic crystal B1 is formed of a semiconducting material, for example. Examples of the semiconducting material comprising the photonic crystal B1 include Si, GaAs, InP, GaN, GaInAsP/InP, InGaAs/GaAs, GaAlAs/GaAs, GaInNAs/GaAs, GaAlInAs/InP, AlGaInP/GaAs, and GaInN/GaN. The photonic crystal B1 in plan view may have, while it has a rectangular shape in FIGS. 15 and 16, any other shape.

The photonic crystal B1 has a top surface 41 and an undersurface 42. The top surface 41 and the undersurface 42 are flat. The photonic crystal B1 has a first side surface SP having a cutout (not shown) into which a terahertz chip 10 is fit.

The photonic crystal B1 includes multiple grid points 31. The grid points 31 diffract a terahertz wave in a photonic band-gap band for a photonic band structure of the photonic crystal B1. The grid points 31 are disposed periodically on an XY plane of the photonic crystal B1. The grid points 31 are each formed of a pore, for example. As shown in FIG. 17, the pores pass through the photonic crystal B1 from the top surface 41 to the undersurface 42. While the pores have round shapes in FIGS. 15 and 16, they may have polygonal shapes or oval shapes. While the periodic array of square grating is shown in FIGS. 15 and 16, the periodic array may be a two-dimensional periodic array such as a rectangular grating, a triangular grating, or a honeycomb grating.

The index of refraction of the terahertz wave can be caused to change by adjusting the grating constant for the grid points 31. This allows the propagation path for the terahertz wave to be controlled. For example, the transmission path can be straightened, bent, branched (demultiplexed), crossed. or directionally coupled (multiplexed). Also, the photonic crystal B1 can planar integrate a compact transmission path adopting a refractive index confinement structure, a filter, a non-linear optical element such as a lens, an antenna, etc.

In the following, five example applications with use of the photonic crystal B1 will be described as the dielectric substrate 50.

Figure 18:
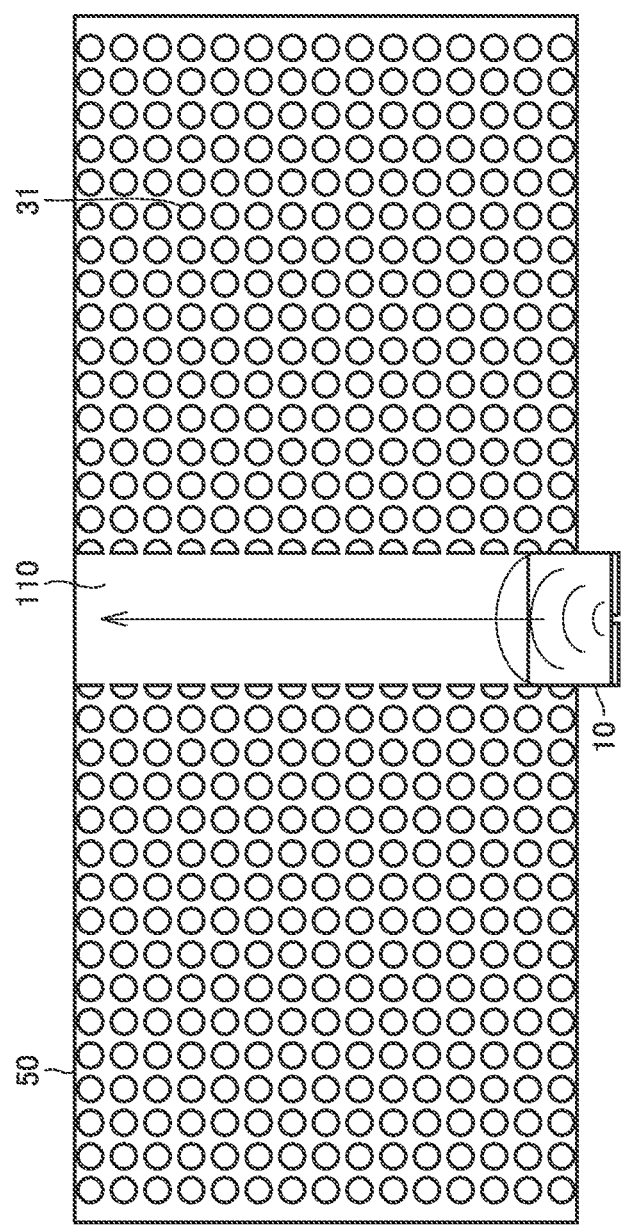
FIG. 18 is a diagram depicting a first example application of the terahertz module.

FIG. 18 is a diagram depicting a first example application of the terahertz module.

The dielectric substrate 50 can form a refractive index distribution by adjusting a grating constant for the grid points 31, and a dielectric waveguide 110 for the terahertz wave is thereby formed. The dielectric waveguide 110 is formed in a direction perpendicular to the upper and lower surfaces of an InP substrate 1. The upper and lower surfaces of the InP substrate 1 are parallel to the first side surface SP of the dielectric substrate 50, the surface 71P of the cutout CS, and the surface 74P of the cutout CS.

Figure 19:
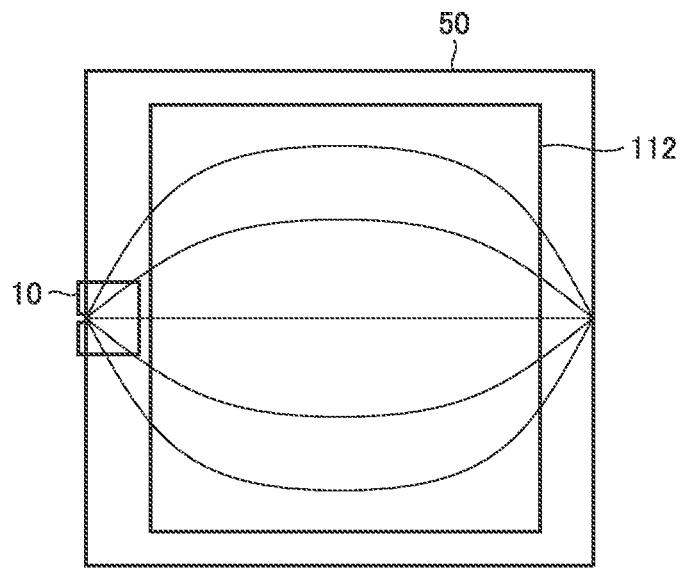
FIG. 19 is a diagram depicting a second example application of the terahertz module.

FIG. 19 is a diagram depicting a second example application of the terahertz module.

The dielectric substrate 50 forms a refractive index distribution by adjusting the grating constant for the grid points, and a planar lens 112 is thereby formed. As shown in FIG. 19, the terahertz wave emitted by the terahertz chip 10 is collected by the planar lens 112.

Note that by adjusting the grating constant for the grid points, the dielectric substrate 50 can form, rather than the planar lens 112, a reflective mirror for reflecting the terahertz wave or a filter for passing therethrough or filtering out a predetermined frequency component of the terahertz wave.

Figure 20:
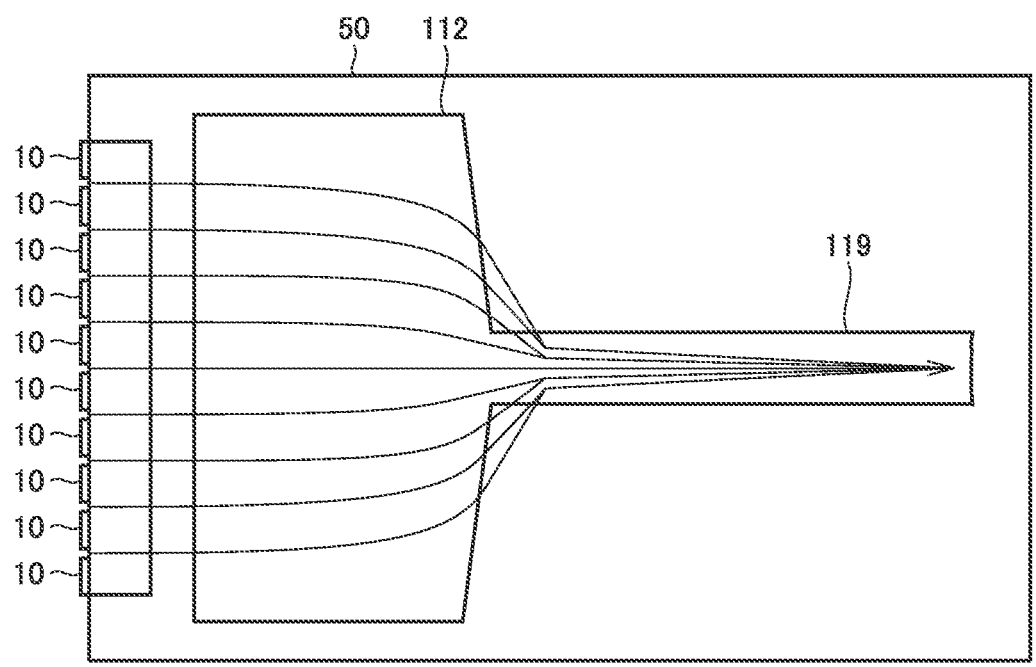
FIG. 20 is a diagram depicting a third example application of the terahertz module.

FIG. 20 is a diagram depicting a third example application of the terahertz module.

Multiple terahertz chips 10 are disposed in a row and coupled to the photonic crystal, thereby forming a terahertz chip array. The terahertz chips 10 emit terahertz waves having frequencies that vary due to differences in drive voltage. The terahertz waves emitted by the terahertz chips 10 are collected by a planar lens 112 and output through an output waveguide 119.

Figure 21:
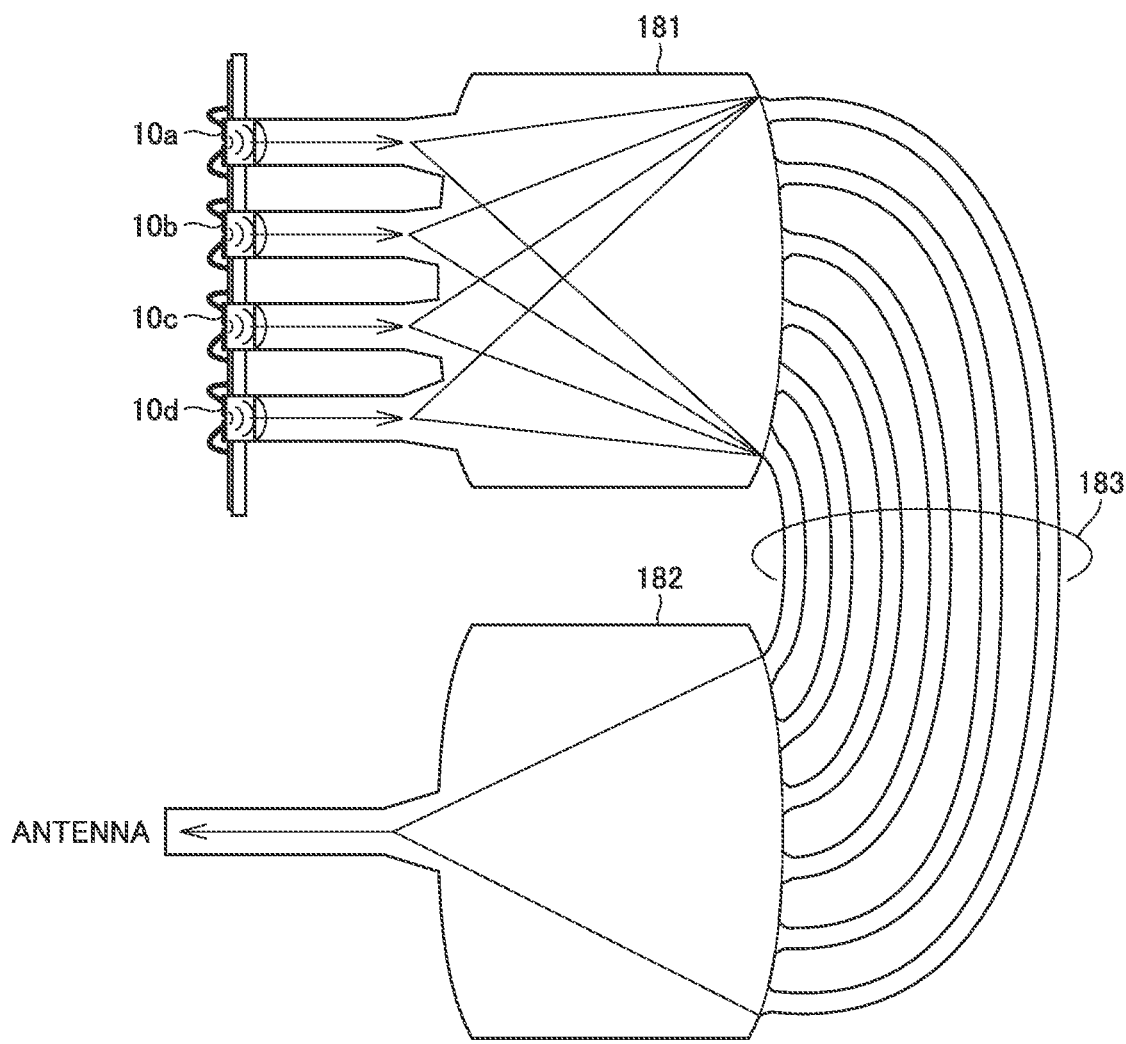
FIG. 21 is a diagram depicting a fourth example application of the terahertz module.

FIG. 21 is a diagram depicting a fourth example application of the terahertz module.

A filter formed on the photonic crystal allows implementation of the frequency multiplexing. Depending on a frequency, multiplexing or demultiplexing is possible.

The terahertz chips 10 emit terahertz waves having different frequencies.

The terahertz waves emitted by the terahertz chips 10 are demultiplexed by a demultiplexer 181, and sent to multiple waveguides 183. The terahertz waves having the frequencies, output from the waveguides 183, are multiplexed by a multiplexer 182. The multiplexed terahertz waves are output to an antenna.

Figure 22:
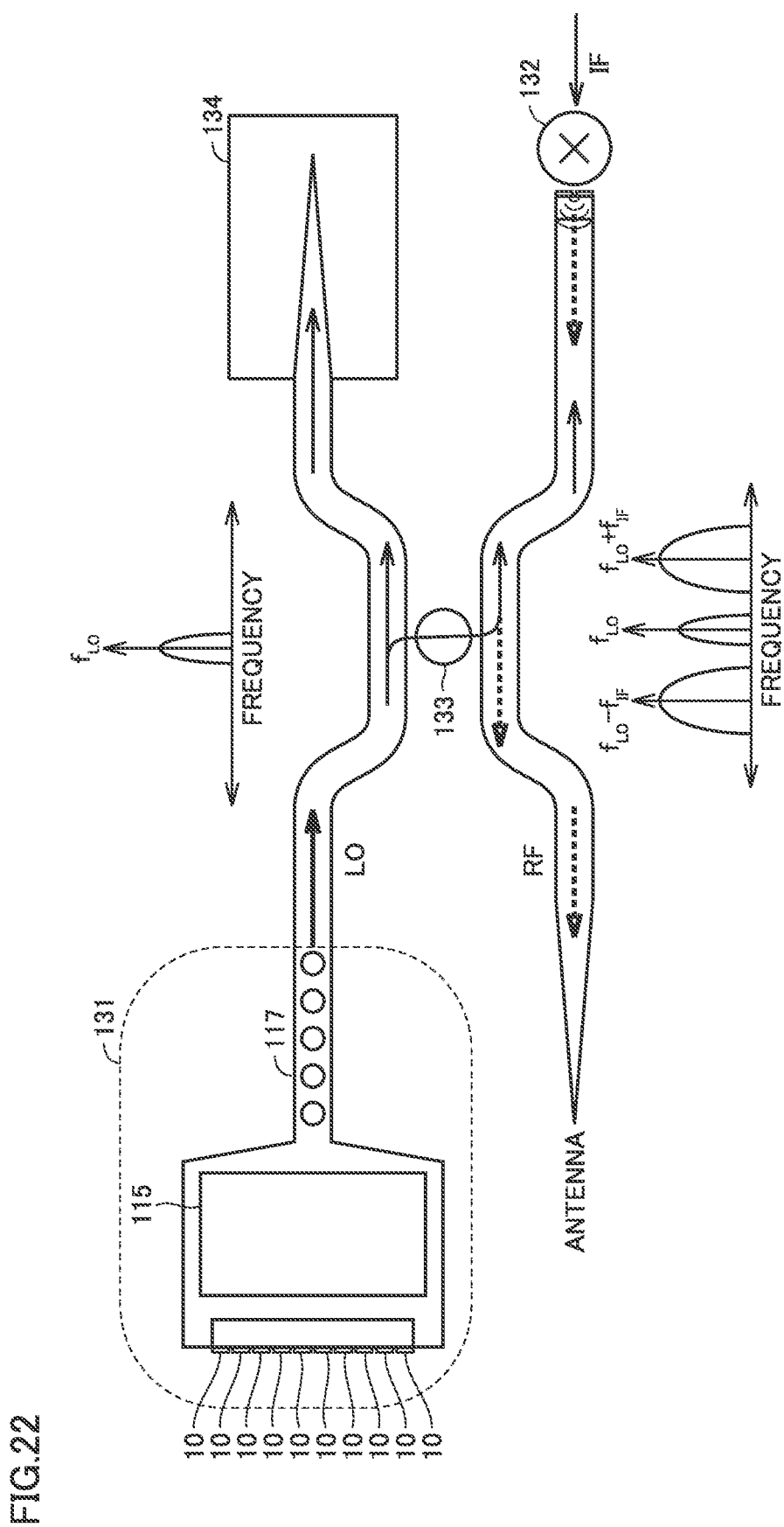
FIG. 22 is a diagram depicting a fifth example application of the terahertz module.

FIG. 22 is a diagram depicting a fifth example application of the terahertz module.

A resonator 117, a coupler 133, a mixer 132, and an absorber 134 are formed on the photonic crystal.

The local oscillator 131 includes: an array in which the terahertz chips 10 are disposed in a row; a complex lens 115; and the resonator 117 having a high-Q value.

A portion of a local oscillating signal LO emitted by the local oscillator 131 is sent to the absorber 134, and the remaining portion is set to the coupler 133. The absorber 134 can prevent the local oscillating signal LO from being reflected.

The coupler 133 passes the local oscillating signal LO to the mixer 132 and blocks a modulated signal RF output from the mixer 132.

The mixer 132 mixes an intermediate frequency signal IF and the local oscillating signal LO and thereby generates a modulated signal RF, and emits the modulated signal RF to an antenna.

Simulation

Next, a result of simulation will be described.

Figure 23:
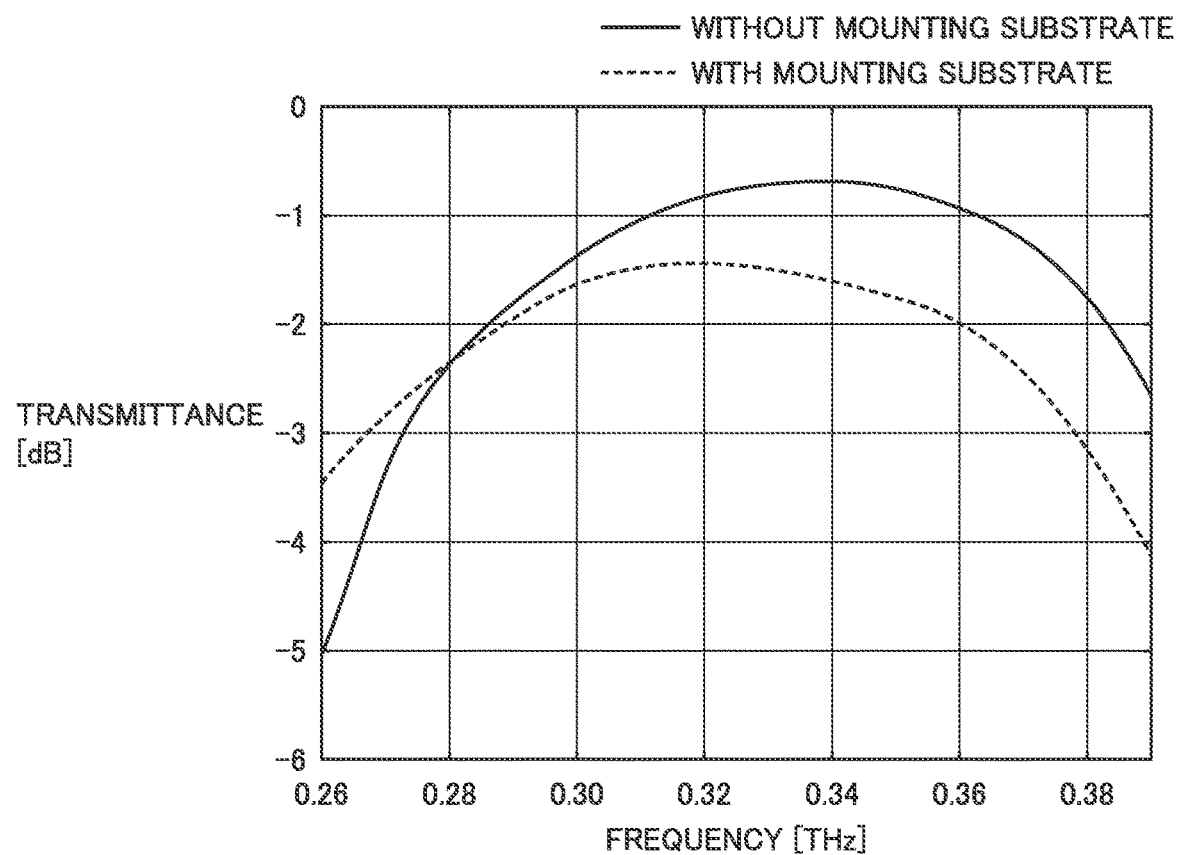
FIG. 23 is a diagram depicting a result of simulation.

FIG. 23 is a diagram depicting a result of simulation.

FIG. 23 shows a transmittance where a microwave circuit board 80 is provided shown in FIG. 11 versus a transmittance where the microwave circuit board 80 is not provided. As shown in FIG. 23, the difference between the two is approximately 1 dB. This suggests that providing the microwave circuit board 80 has sufficiently small impact on the transmittance.

Variations

The present disclosure is not limited to the above embodiments. For example, the present disclosure encompasses the following variations.

(1) While the RTD is used as an example of an active device in the above embodiments, the active device can be configured of any other diode or transistor. For example, a tunnel transit time (TUNNETT) diode, an impact ionization avalanche transit time (IMPATT) diode, a GaAs-based field effect transistor (FET), a GaN-based FET, a high electron mobility transistor (HEMT), a heterojunction bipolar transistor (HBT), a complementary metal-oxide-semiconductor (CMOS) FET, etc. can be used as the active device.

(2) While the example is shown in which the terahertz chip includes a first tunnel barrier layer/a quantum well (QW) layer/a second tunnel barrier layer have the configuration of AlAs/GaInAs/AlAs, the present disclosure is not limited to such a material system. For example, the first tunnel barrier layer/the quantum well layer/the second tunnel barrier layer may have a configuration of AlGaAs/GaAs/AlGaAs. The first tunnel barrier layer/the quantum well layer/the second tunnel barrier layer may also have a configuration of AlGaN/GaN/AlGaN. The first tunnel barrier layer/the quantum well layer/the second tunnel barrier layer may still also have a configuration of SiGe/Si/SiGe.

(3) While the terahertz chip includes the slot antenna or the bow-tie antenna in the above embodiments, the present disclosure is not limited thereto. The antenna included in the terahertz chip may have any shape insofar as the antenna reflects the radio wave (the terahertz wave) in a direction perpendicular to the substrate. For example, the terahertz chip may include a planar antenna such as a patch antenna, a dipole antenna, or a ring antenna.

The presently disclosed embodiments should be considered in all aspects as illustrative and not restrictive. The scope of the present disclosure is defined by the appended claims, rather than by the description above. All changes which come within the meaning and range of equivalency of the appended claims are to be embraced within their scope.

REFERENCE SIGNS LIST 1, 191 InP substrate; 2 lower electrode; 4 upper electrode; 4B antenna electrode; 6a, 6b MIM capacitor; 9 low-pass filter; 10, 192 terahertz chip; 20 RTD; 30 slot; 20P, 40P pad electrode; 31 grid point; 40F second transmission line; 40S first transmission line; 41 top surface; 42 undersurface; 50 dielectric substrate; 70 coaxial connector; 71P, 72P, 73P, 74P, 75P, 76P surface; 8 microwave circuit board; 80a metallic layer of microwave circuit board; 80b resin layer of microwave circuit board; 84 groove; 90 bonding wire; 91a, 91b, 92a, 92b, 93a, 93b, 94a, 94b, 95 surface; 98, 98a, 98b SiO$_2$ film; 110 dielectric waveguide; 112 planar lens; 115 complex lens; 117 resonator; 119 output waveguide; 131 local oscillator; 132 mixer; 133 coupler; 134 absorber; 139a, 139b conductive path; 181 demultiplexer; 182 multiplexer; 183 waveguide; B1 photonic crystal; CS cutout; LS lower side; SP side surface; SRL SR2 shunt resistor; and US upper side.

The invention claimed is:

1. A terahertz module, comprising
a terahertz chip which includes an active device which emits a terahertz wave;
a dielectric substrate coupled to the terahertz chip, wherein
the terahertz chip includes a semiconductor substrate and the active device is disposed on an upper surface of the semiconductor substrate,
a cutout is formed in a portion of a first side surface, among a plurality of side surfaces of the dielectric substrate, the cutout extending from an upper side of the first side surface to a lower side of the first side surface,
the terahertz chip is fit into the cutout in such a direction that the upper surface of the semiconductor substrate is parallel to the first side surface and the semiconductor substrate is arranged in a bottom side of the cutout, and
the terahertz chip has a thickness which is equal to a depth of the cutout.

2. The terahertz module according to claim 1, wherein
the cutout has a surface parallel to the first side surface, and
the semiconductor substrate has a lower surface in contact with a surface of the cutout parallel to the first side surface.

3. The terahertz module according to claim 1, wherein
the dielectric substrate is a photonic crystal.

4. The terahertz module according to claim 3, wherein
a waveguide for the terahertz wave is formed on the photonic crystal in a direction perpendicular to the upper surface of the semiconductor substrate.

5. The terahertz module according to claim 3, wherein
a filter for passing or filtering out a predetermined frequency component of the terahertz wave is formed on the photonic crystal.

6. The terahertz module according to claim 3, wherein
a planar lens for collecting the terahertz wave emitted by the active device is formed on the photonic crystal.

7. The terahertz module according to claim 3, wherein
a plurality of the terahertz chips disposed in a row are coupled to the photonic crystal.

8. The terahertz module according to claim 1, wherein the active device is a resonant tunneling diode.

9. A terahertz module, comprising
a terahertz chip which includes an active device which emits a terahertz wave;
a dielectric substrate coupled to the terahertz chip, wherein
the terahertz chip includes a semiconductor substrate and the active device is disposed on an upper surface of the semiconductor substrate,
a cutout is formed in a portion of a first side surface, among a plurality of side surfaces of the dielectric substrate, the cutout extending from an upper side of the first side surface to a lower side of the first side surface, and
the terahertz chip is fit into the cutout in such a direction that the upper surface of the semiconductor substrate is parallel to the first side surface and the semiconductor substrate is arranged in a bottom side of the cutout, and
the terahertz chip has a thickness greater than a depth of the cutout.

10. The terahertz module according to claim 9, wherein
the cutout has a surface parallel to the first side surface, and
the semiconductor substrate has a lower surface in contact with a surface of the cutout parallel to the first side surface.

11. The terahertz module according to claim 9, wherein
the dielectric substrate is a photonic crystal.

12. The terahertz module according to claim 11, wherein
a waveguide for the terahertz wave is formed on the photonic crystal in a direction perpendicular to the upper surface of the semiconductor substrate.

13. The terahertz module according to claim 11, wherein
a filter for passing or filtering out a predetermined frequency component of the terahertz wave is formed on the photonic crystal.

14. The terahertz module according to claim 11, wherein
a planar lens for collecting the terahertz wave emitted by the active device is formed on the photonic crystal.

15. The terahertz module according to claim 11, wherein
a plurality of the terahertz chips disposed in a row are coupled to the photonic crystal.

16. The terahertz module according to claim 9, wherein the active device is a resonant tunneling diode.

* * * * *